United States Patent
Kamo

(10) Patent No.: US 9,164,371 B2
(45) Date of Patent: Oct. 20, 2015

(54) METHOD OF CORRECTING DEFECTS IN A REFLECTION-TYPE MASK AND MASK-DEFECT CORRECTION APPARATUS

(75) Inventor: Takashi Kamo, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 849 days.

(21) Appl. No.: 13/423,644

(22) Filed: Mar. 19, 2012

(65) Prior Publication Data

US 2012/0307218 A1 Dec. 6, 2012

(30) Foreign Application Priority Data

May 30, 2011 (JP) ................................. 2011-121041

(51) Int. Cl.
*G03B 27/62* (2006.01)
*G03B 27/32* (2006.01)
(Continued)

(52) U.S. Cl.
CPC .. *G03F 1/24* (2013.01); *G03F 1/72* (2013.01); *G03F 7/70283* (2013.01); *G03F 7/70908* (2013.01)

(58) Field of Classification Search
CPC ............... G03F 1/24; G03F 1/72; G03F 1/74; G03F 1/80–1/86; G03F 7/70283; G03F 7/703; G03F 7/70591; G03F 7/70616; G03F 7/7065; G03F 7/70666; G03F 7/7085; G03F 7/70866; G03F 7/70908; G03F 7/70916; G03F 7/70925; G03F 7/70991

USPC ............... 355/30, 52, 53, 55, 67–71, 75–77; 250/492.1, 492.2, 492.22, 493.1, 504 R, 250/548; 430/5, 8, 22, 30, 311, 312, 321
See application file for complete search history.

(56) References Cited

U.S. PATENT DOCUMENTS 6,091,845 A * 7/2000 Pierrat et al. .................. 382/144
6,340,543 B1 * 1/2002 Nagamura et al. ................. 430/5
(Continued)

FOREIGN PATENT DOCUMENTS

JP 2005-532581 A 10/2005
JP 2007-273652 10/2007
(Continued)

OTHER PUBLICATIONS

First Office Action, issued by Japanese Patent Office, mailed Feb. 25, 2014, in Japanese Patent Application No. 2011-121041 (6 pages including translation).
(Continued)

*Primary Examiner* — Christina Riddle
(74) *Attorney, Agent, or Firm* — Finnegan, Henderson, Farabow, Garrett & Dunner, LLP

(57) ABSTRACT

According to one embodiment, a method of correcting defects in a reflection-type mask is provided, which comprises acquiring a mask-pattern image of the mask, by using a mask-defect correction apparatus includes a mechanism configured to detect a defect in the mask and a mechanism configured to correct the defect, acquiring a simulated wafer-transfer optical image for the mask, by using an AIMS configured to simulate a wafer-transfer optical image, thereby to determine whether the mask is defective, locating a mask defect, in a mask-pattern image acquired by the mask-defect correction apparatus, by referring to the simulated pattern image acquired by the AIMS, and correcting the defect by the mask-defect correction apparatus, on the basis of the position of the mask defect, thus detected.

8 Claims, 5 Drawing Sheets

(51) Int. Cl.
*G03F 1/24* (2012.01)
*G03F 7/20* (2006.01)
*G03F 1/72* (2012.01)
*G03B 27/52* (2006.01)

(56) References Cited

U.S. PATENT DOCUMENTS

| | | | |
|---|---|---|---|
| 7,629,088 B2* | 12/2009 | Itoh | 430/5 |
| 2003/0082460 A1* | 5/2003 | Stivers et al. | 430/5 |
| 2003/0095699 A1* | 5/2003 | Hung et al. | 382/149 |
| 2005/0238221 A1* | 10/2005 | Hirano et al. | 382/144 |
| 2006/0154150 A1 | 7/2006 | Engel et al. | |
| 2006/0204862 A1* | 9/2006 | Park et al. | 430/5 |
| 2009/0297988 A1* | 12/2009 | Tanaka | 430/319 |
| 2010/0092876 A1* | 4/2010 | Kanamitsu | 430/5 |
| 2010/0254591 A1* | 10/2010 | Scherubl et al. | 382/144 |

FOREIGN PATENT DOCUMENTS

| | | |
|---|---|---|
| JP | 2009-071169 | 4/2009 |
| JP | 2009-290002 | 12/2009 |
| JP | 2010-085778 A | 4/2010 |
| JP | 2010-129755 | 6/2010 |

OTHER PUBLICATIONS

Clifford, et al., "Compensation methods using a new model for buried defects in extreme ultraviolet lithography masks", Proc. of SPIE, vol. 7823, 78230V-1, pp. 1-10, (2010).

* cited by examiner

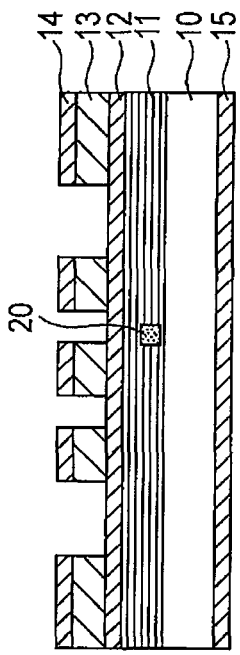
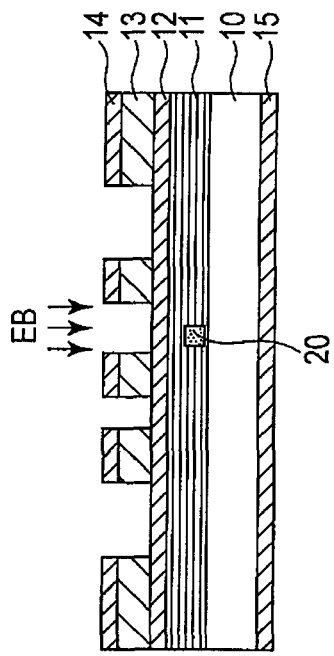
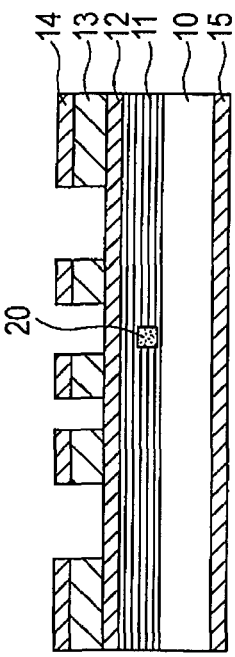
FIG. 4A  FIG. 4B  FIG. 4C
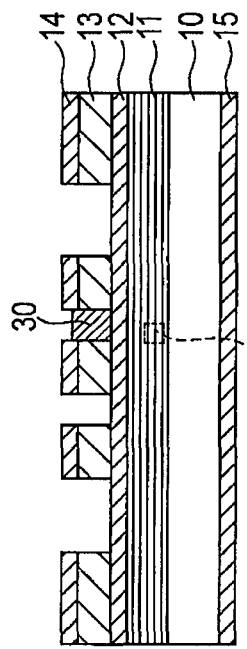
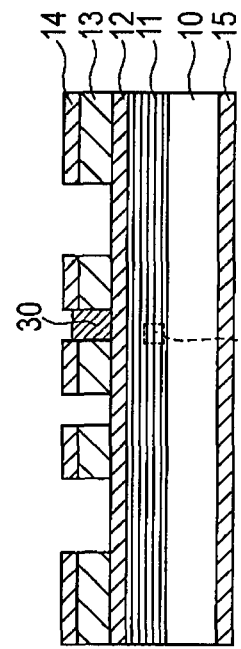
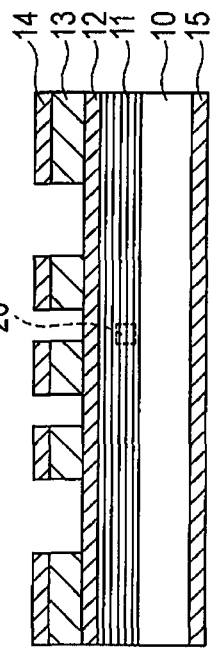
FIG. 5A  FIG. 5B  FIG. 5C

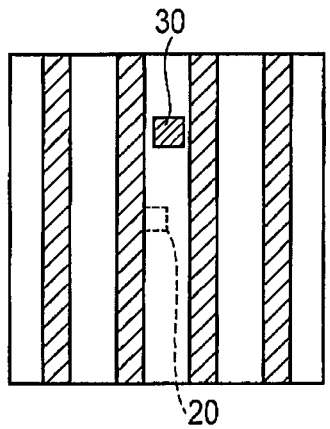
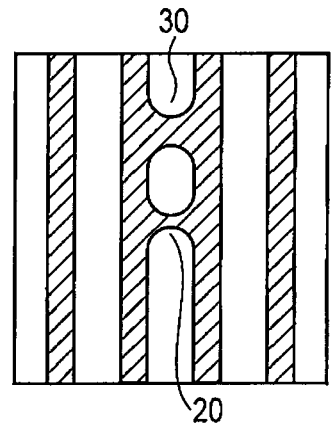
FIG. 6A   FIG. 6B
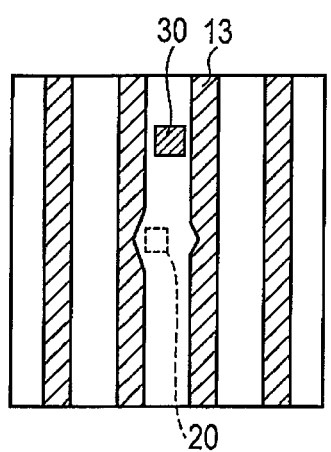
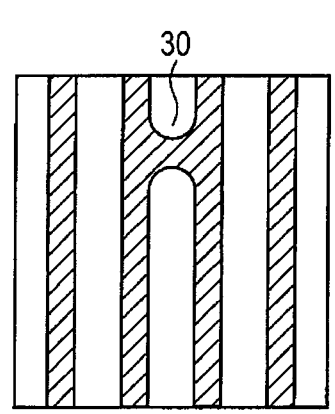
FIG. 7A   FIG. 7B

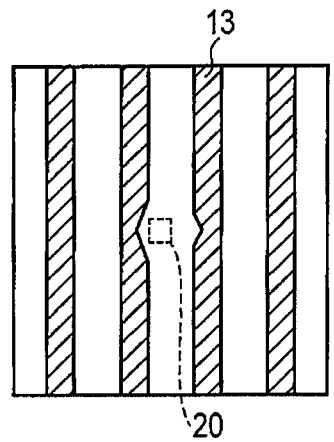
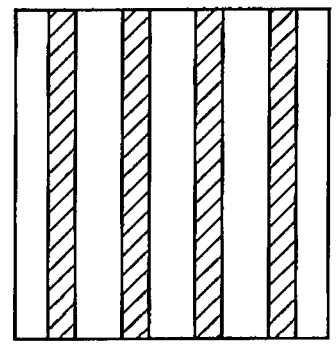
FIG. 8A        FIG. 8B
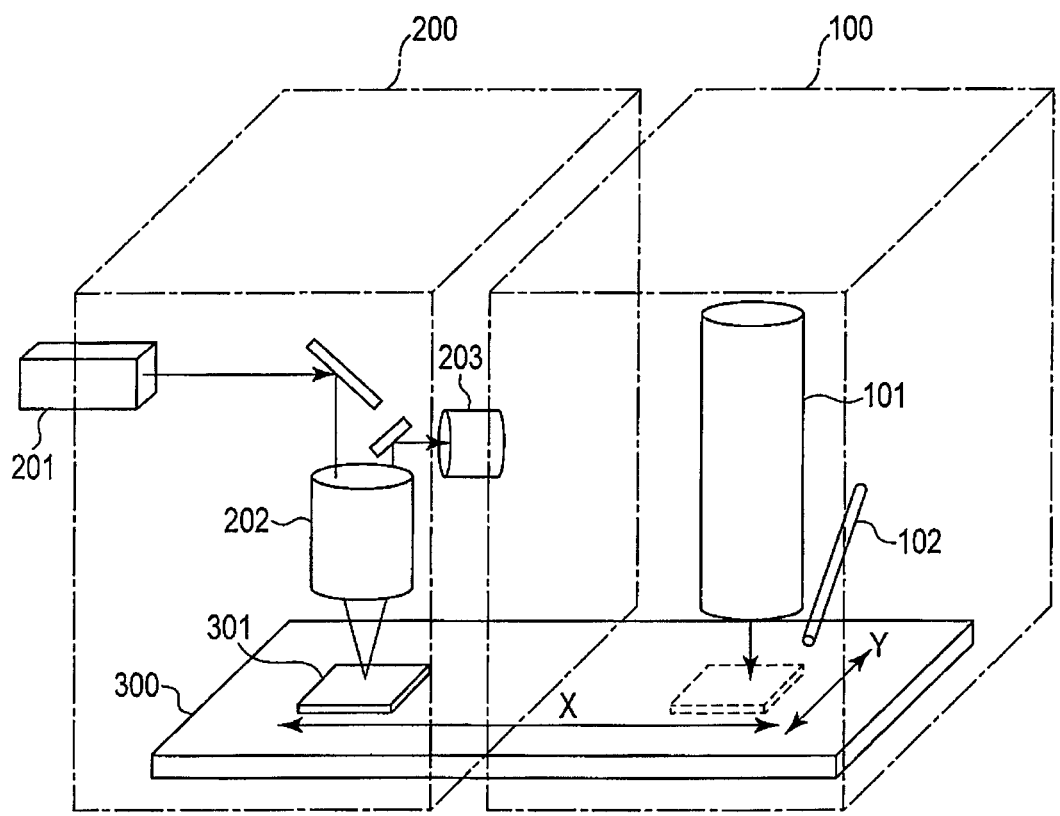
FIG. 9

METHOD OF CORRECTING DEFECTS IN A REFLECTION-TYPE MASK AND MASK-DEFECT CORRECTION APPARATUS

CROSS-REFERENCE TO RELATED APPLICATIONS

This application is based upon and claims the benefit of priority from prior Japanese Patent Application No. 2011-121041, filed May 30, 2011, the entire contents of which are incorporated herein by reference.

FIELD

Embodiments described herein relate generally to a method of correcting defects in a reflection-type mask and a mask-defect correction apparatus.

BACKGROUND

In recent years, it is discussed in the field of lithography technology that exposure light in the wavelength region called the extreme ultraviolet (EUV) region in which the intermediate value is 13.5 nm should be used to meet the demand for the miniaturization of semiconductor devices. Masks for use in EUV lithography are reflection-type masks. The reflection-type mask is produced in the following method. Layers of two types, each having a different reflectance, are alternately laid on a glass substrate, thus forming a multi-layer film. On the multi-layer film, a film called an absorber is formed. The absorber is then processed, whereby a circuit pattern is formed.

As defects inherent to the EUV mask, multi-layer film defects are mentioned. The multi-layer film defects have resulted from the pits or the bumps made on the surface of the substrate. Alternatively, they have resulted from foreign matter that has stuck to the substrate before or during the forming of the multi-layer film. If such foreign matter exists, the cycle of the multi-layer film is disturbed, inevitably resulting in a phase difference with respect to any normal part. This phase difference is known as a phase defect. The multi-layer film must therefore be inspected for phase defects, before the absorber is formed on the multi-layer film called a blank.

If the phase defects are left undetected at the blank inspection, the phase defects of the resultant mask will be exposed from the absorber pattern. A technique of avoiding this is available, which hides the phase defects under the absorber pattern. Even if this technique is applied and if a mask is made from a blank having phase defects known in position and size, the phase detects may be exposed from the absorber pattern when the blank is processed into a mask. In this case, the phase defects must be corrected. However, it is difficult to locate the phase positions in the image the correction apparatus displayed, because the steps resulting from the phase defects are very low, or several nanometers or less, at the surface of the multi-layer film.

BRIEF DESCRIPTION OF THE DRAWINGS

FIGS. 4A to 4C are sectional views showing the sequence of a method of correcting defects in a reflection-type mask, according to a second embodiment, and showing a phase defect;

FIGS. 5A to 5C are sectional views showing the sequence of the method according to the second embodiment, and showing a mark;

FIGS. 6A and 6B are diagrams explaining the method according to the second embodiment, and showing the SEM image and AIMS image of the mask that has been subjected to mark forming;

FIGS. 7A and 7B are diagrams explaining the method according to the second embodiment, and showing the SEM image and AIMS image of the mask that has been subjected to defect correction;

FIGS. 8A and 8B are diagrams explaining the method according to the second embodiment, and showing the SEM image and AIMS image of the mask that has been subjected to mark removal; and FIG. 9 is a schematic diagram showing the configuration of an apparatus for correction in a reflection-type mask, according to a third embodiment.

DETAILED DESCRIPTION

In general, according to one embodiment, a method of correcting defects in a reflection-type mask is provided. The method comprises: acquiring a mask-pattern image of the mask, by using a mask-defect correction apparatus comprising a mechanism configured to detect a defect in the mask and a mechanism configured to correct the defect; acquiring a simulated wafer-transfer optical image for the mask, by using an AIMS configured to simulate a wafer-transfer optical image, thereby to determine whether the mask is defective; locating a mask defect, in a mask-pattern image acquired by the mask-defect correction apparatus, by referring to the simulated pattern image acquired by the AIMS; and correcting the defect by the mask-defect correction apparatus, on the basis of the position of the mask defect, thus detected.

Methods of correcting defects in a reflection-type mask, and a mask-defect correction apparatus, both according to various embodiments, will be described with reference to the accompanying drawings.

(First Embodiment)

FIGS. 1A to 1E are sectional views showing the sequence of a method of correcting defects in a reflection-type mask, according to a first embodiment. More precisely, FIGS. 1A to 1E show a sequence of correcting an EUV exposure mask made from a blank having phase errors.

Figure 1A:
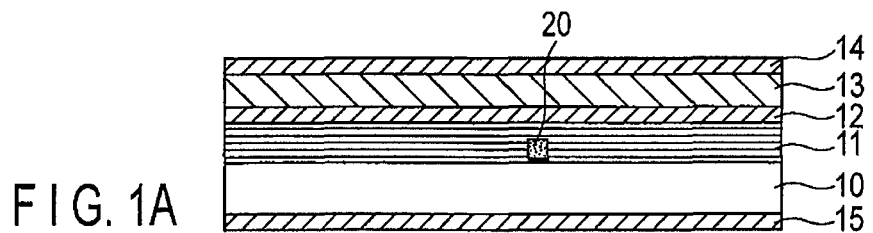
FIGS. 1A to 1E are sectional views showing the sequence of a method of correcting defects in a reflection-type mask, according to a first embodiment.

FIG. 1A shows a mask blank comprising a substrate 10, a multi-layer reflection film, and an absorber. The multi-layer reflection film and the absorber are laid, one upon the other, on the front of the substrate 10. To be more specific, about 40 Mo/Si layers are formed, one laid upon another, on the substrate 10 having a low thermal expansion coefficient. An Mo/Si multi-layer film (multi-layer reflection film) 11 that reflects exposure light is thereby provided. On the Mo/Si multi-layer film 11, an Ru film is formed as protection layer 12. Further, on the protection layer 12, an absorber 13 made of TaBN is formed to absorb exposure light. On the absorber 13, a low-reflection layer (LR layer) 14 is formed. On the back of the substrate 10, an electrically conductive layer 15 is formed and used as, for example, an electrostatic chuck. Assume that a phase defect 20 exists in the multi-layer film 11.

Figure 1B:
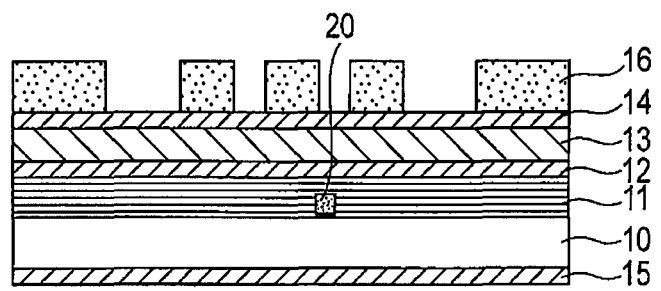
Figure 1C:
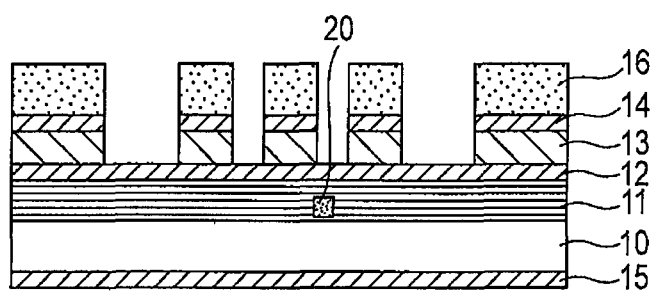
Figure 1D:
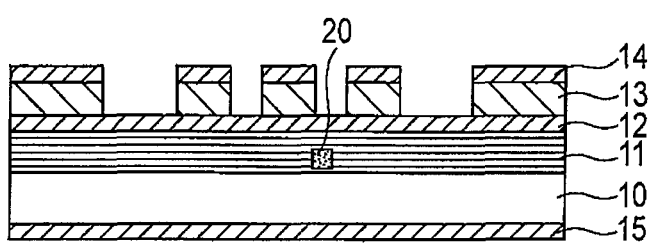
Figure 1E:
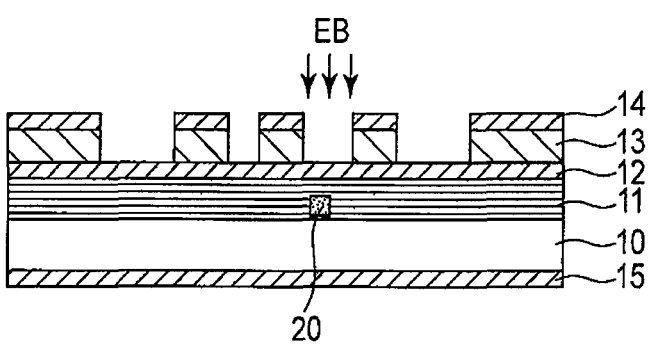

As shown in FIG. 1B, positive-type resist 16 for use in EB drawing is applied on the mask blank, and EB drawing and developing are performed, thereby accomplishing patterning. Next, the LR layer 14 and the absorber 13 are patterned by means of RIE process as shown in FIG. 1C. Thereafter, as shown in FIG. 1D, the resist 16 is peeled off, and the resultant product is washed. A mask is thereby produced.

The mask is transported to a mask-defect correction apparatus. In the mask-defect correction apparatus, the defect 20 is detected and corrected as will be described below. The mask-defect correction apparatus comprises a mechanism configured to apply an electron beam to scan the mask, and a mechanism configured to apply gas to the mask. The apparatus can locally deposit and remove the absorber. Further, the apparatus can generate an SEM image of the mask, by scanning the mask with an electron beam.

In the mask-defect correction apparatus, the mask of FIG. 1D is subjected to a mask inspecting step, in which coordinate data is acquired of the mask defect detected in the blank. The mask is then subjected to an Aerial Imaging Measuring System (AIMS) step, to determine the mask is defective or not, on the basis of the coordinate data acquired in the mask inspecting step. In the AIMS, a spatial image of the mask pattern is measured in an exposure state equivalent or correlated to the exposure light and is compared with a reference pattern, thereby to determine whether the mask is defective or not. In the AIMS, the illumination system and the exposure system are almost equivalent to each other, but the mask observation region is extremely small.

Figure 2A:
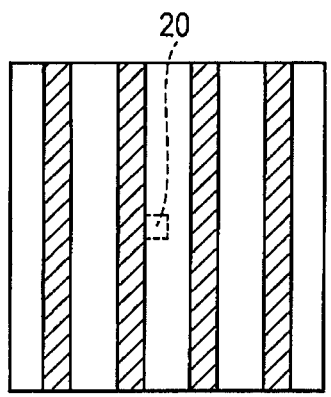
FIGS. 2A and 2B are diagrams explaining the method according to the first embodiment and showing the SEM image and AIMS image of the mask that will be subjected to defect correction.
Figure 2B:
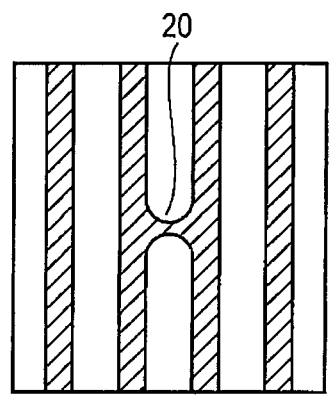

The mask-defect correction apparatus has a defect detection function of scanning the mask with an electron beam, thereby acquiring an SEM image of the mask. The defect detection function alone cannot inspect the mask to detect the phase defect 20 existing in the multi-layer film 11. This is why the mask is inspected in the AIMS, thereby detecting the size and position of the phase defect 20. FIG. 2A and FIG. 2B show the SEM image and AIMS image of the mask, respectively, which the AIMS has acquired. In the SEM image shown in FIG. 2A, the phase defect 20 cannot be located. By contrast, the phase defect 20 can be accurately located in the AIMS image shown in FIG. 2B.

Therefore, on the basis of the mask defect located in the AIMS image, the defect is corrected in the mask-defect correction apparatus. To be more specific, the SEM image is aligned with the reference points of the AIM image in terms of coordinates. The position the phase errors can therefore be inferred, also in the mask-defect correction apparatus. Then, etchant gas is supplied and selective application of an electron beam is performed, thereby removing that part of the absorber 13, which seems surrounding the phase defect. The phase defect 20 is thereby corrected.

Figure 3A:
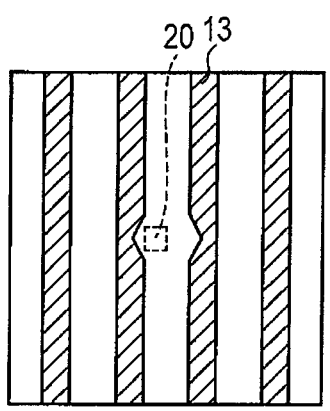
FIGS. 3A and 3B are diagrams explaining the method according to the first embodiment, and showing the SEM image and AIMS image of the mask that has been subjected to defect correction.
Figure 3B:
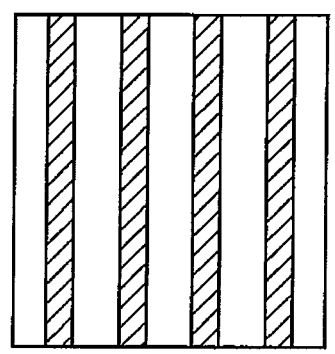

FIGS. 3A and 3B show the SEM image and AIMS image of the mask subjected to defect correction which have been corrected. As seen from the SEM image of FIG. 3A, the absorber 13 has been removed in part near the phase error 20. As seen from the AIMS image of FIG. 3B, the phase error has been corrected.

The protection layer 12 is an Ru film in this embodiment. Nonetheless, the protection layer 12 can be made of Si, instead of Ru. Further, a buffer made mainly of CrN may be interposed between the absorber 13 and the protection layer 12. Still further, the defect may be corrected by using an ion beam, not an electron beam as in this embodiment.

Thus, in this embodiment, the phase error is located in the AIMS image, thereby accurately locate the phase error, which the imaging function of the mask-defect correction apparatus cannot accomplish. Then, the mask-defect correction apparatus corrects the mask defect located in the AIMS image. The phase error can therefore be corrected at a higher accuracy than otherwise.

(Second Embodiment)

FIGS. 4A to 4C and FIGS. 5A to 5C are sectional views explaining the sequence of a method of correcting defects in a reflection-type mask, according to a second embodiment, are more precisely sectional views showing the sequence of correcting an EUV exposure mask having a phase error. Note that FIGS. 4A to 4C show a cross section of a phase error, and FIGS. 5A to 5C show a cross section of a mark.

As in the first embodiment, a mask formed in the manufacturing steps of FIG. 1A to 1D is transported to the mask-defect correction apparatus. The mask is subjected to the mask inspecting step, and then to an AIMS step. In the AIMS step, whether the mask is defective or not is determined from the coordinate data about the phase defect detected in the blank and the coordinate data acquired in the mask inspecting step.

As described above, the defect detection function of the alone cannot inspect the mask in the mask-defect correction apparatus, in order to detect the phase defect 20 existing in the multi-layer film 11. Therefore, in the AIMS the mask is inspected, detecting the size and position of the phase defect 20. The SEM image and AIMS image of the mask, both obtained by the mask-defect correction apparatus, are shown in FIG. 2A and FIG. 2B. The phase defect 20 can be accurately located in the AIMS image shown in FIG. 2B.

Therefore, as shown in FIGS. 4A and 5A, a one-point marker 30 is formed by means of carbon deposition, near the phase defect 20, on the basis of the AIMS image. More precisely, deposition gas is supplied into the mask-defect correction apparatus and an electron beam is applied to a point near the defect, thereby forming a marker 30 made of carbon or material whose principal component is carbon. The position where the marker 30 is formed need not be controlled so accurately. It suffices to form the marker 30 near the phase defect position that has been inferred from the defect position located in the AIMS image.

FIGS. 6A and 6B show the SEM image and AIMS image of the mask, respectively, which has the marker 30 and has been inspected. In the SEM image shown in FIG. 6A, the phase defect 20 cannot be detected, but the marker 30 can be detected. In the AIMS image shown in FIG. 6B, both the phase defect 20 and the marker 30 can be detected. The positional relation the phase defect 20 unable to be detected by the imaging in the mask-defect correction apparatus has with the marker 30 is calculated in the AIMS. The position of the phase defect 20 to be corrected in the mask-defect correction apparatus can therefore be specified.

Next, as shown in FIGS. 4B and 5B, that part of the absorber 13, which surrounds the phase defect 20 is removed, thereby correcting the phase defect 20. This correction is achieved, only by supplying etchant gas and an electron beam to that part of the absorber 13 in the same manner as in the first embodiment. FIGS. 7A and 7B show the SEM image and AIMS image of the mask corrected as described above. As seen from the SEM image of FIG. 7A, that part of the absorber 13, which surrounds the phase defect 20 has been removed. As seen from the AIMS image of FIG. 7B, the phase defect 20 has been corrected. The defect may drift while being corrected. In this case, the position of the defect is corrected, compensating for its drift, in accordance with the positional relation that the one-point marker 30 has with the defect in the AIMS image.

Then, as shown in FIGS. 4C and 5C, the one-point marker 30 is removed after that part of the absorber 13, which lies near the phase defect 20, has been processed. The correction of the phase defect 20 is thus completed. To remove the marker 30, it suffices to supply the etchant gas into the mask-defect correction apparatus and to apply an electron beam to the marker 30. FIGS. 8A and 8B show the SEM image and AIMS image of the mask from which the marker 30 has been removed.

In this embodiment, the marker 30 may be processed by means of carbon deposition. Alternatively, the marker 30 may be processed by etching a part of the absorber 13. This part of the absorber 13 can be detected in the SEM image, and can therefore be used as a one-point marker in the same way as the marker 30. After that part of the absorber, which lies near the phase defect, has been processed, carbon-containing gas is applied to the absorber 13 processed to form a one-point marker, thereby depositing shield material. The product therefore assumes the initial state, free of transfer impacts. In this embodiment, an electron beam is applied, correcting the defect. Instead, an ion beam may be applied to correct the defect.

Thus, this embodiment can accurately locate a phase defect in an AIMS image, which cannot be detected by the imaging function of the mask-defect correction apparatus alone. The embodiment can therefore achieve an advantage similar to that of the first embodiment. Further, since a one-point process is performed at a position near the phase defect, the embodiment can locate, in the AIMS image, the relation between the one-point process position and the defect correction position. The position of the phase defect can therefore be accurately determined even if the defect drifts while being corrected. This can increase the phase-defect correction accuracy.

(Third Embodiment)

FIG. 9 is a schematic diagram showing the configuration of a mask-defect correction apparatus according to a third embodiment.

The mask-defect correction apparatus according to this embodiment comprises an AIMS module 200, in addition to a defect correction module 100 of the same type used in the ordinary defect correction apparatus. The defect correction module 100 incorporates an EB mirror barrel 101, a gas nozzle 102, etc. In the defect correction module 100, an electron is applied to a mask to detect a defect (in an SEM image), and gas is applied to the mask to correct any defect detected (to remove a black-type defect and deposit a film on a white-type defect). The AIMS module 200 incorporates a light source 201 for emitting, for example, UV light, a bright-field optical system 202 and a detector 203 such as CCD. In the AIMS module 200, a wafer-transfer optical image is simulated to determine whether the mask is defective or not.

The mask-defect correction apparatus further comprise a stage 300. The stage 300 can move into both the defect correction module 100 and the AIMS module 200. A mask 301 is mounted on the stage 300, and can therefore move into the defect correction module 100 and AIMS module 200 as the stage 300 is moved.

In this embodiment, the stage 300 can be used in both the defect correction module 100 and the AIMS module 200. Therefore, a positional change of the mask 201 in the defect correction module 100 and AIMS module 200 does not occur or can, if any, be reduced. Since the positional change of the mask 301 is eliminated, any defect on the mask 301 can be accurately corrected, because it is located in an AIMS image as in the first embodiment. Moreover, the time required for correcting the defect can be shortened since the defect correction and the AIMS measuring are performed in the same apparatus.

(Modified Embodiment)

This invention is not limited to the embodiments described above. In each embodiment described above, the mask used is an EUV exposure mask. Nonetheless, the mask need not be limited to an EUV exposure mask, and may be any reflection-type mask. Further, the multi-layer film, absorber and the other member constituting the mask are not limited to those used in the embodiments. They can be replaced by other types, as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of correcting defects in a reflection mask, comprising:
    providing a mask-defect correction apparatus comprising a mechanism configured to detect a defect in the mask and a mechanism configured to correct the defect, and an Aerial Imaging Measurement System (AIMS) configured to simulate a wafer-transfer optical image, thereby to determine whether the mask is defective;
    using the AIMS to detect a phase defect in a blank of the mask;
    forming, near the defect detected, a marker capable of being detected by the mask-defect correction apparatus;
    detecting the marker by the mask-defect correction apparatus, and correcting the defect with reference to the position of the marker; and
    removing the marker from the mask in which the defect has been corrected.

2. The method according to claim 1, wherein forming a marker is to deposit a material whose principal component is carbon locally on the mask.

3. The method according to claim 1, wherein forming a marker is to etch a part of a pattern formed on the mask.

4. The method according to claim 3, wherein removing the marker is to deposit shield material at the part of the pattern, which has been etched.

5. The method according to claim 1, wherein correcting the defect is to measure a distance from the marker to the defect by the AIMS, and to correct the defect by the mask-defect correction apparatus on the assumption that the defect exists at the distance measured.

6. The method according to claim 1, wherein the mask has been produced by forming a multi-layer reflection film and forming an absorber pattern on the multi-layer reflection film.

7. The method according to claim 6, wherein the defect is a phase defect existing in the multi-layer reflection film.

8. The method according to claim 1, wherein the mask-defect correction apparatus comprises a mechanism configured to apply gas or an electron beam, thereby to deposit or remove an absorber locally, and a mechanism configured to acquire a SEM image by means of electron beam scanning.

* * * * *